United States Patent [19]

Hawes et al.

[11] Patent Number: 5,384,500
[45] Date of Patent: Jan. 24, 1995

[54] PROGRAMMABLE LOGIC DEVICE MACROCELL WITH AN EXCLUSIVE FEEDBACK AND AN EXCLUSIVE EXTERNAL INPUT LINE FOR A COMBINATORIAL MODE AND ACCOMMODATING TWO SEPARATE PROGRAMMABLE OR PLANES

[75] Inventors: Mark A. Hawes; Paul S. Zagar, both of Boise, Id.

[73] Assignee: Micron Semiconductor, Inc., Boise, Id.

[21] Appl. No.: 171,865

[22] Filed: Dec. 22, 1993

Related U.S. Application Data

[63] Continuation of Ser. No. 884,505, May 15, 1992, abandoned.

[51] Int. Cl.⁶ .................................... H03K 19/173
[52] U.S. Cl. ..................................... 326/39; 326/65; 326/56
[58] Field of Search ................. 307/465, 475, 243, 443

[56] References Cited

U.S. PATENT DOCUMENTS

| | | |
|---|---|---|
| 3,287,702 | 11/1966 | Borck, Jr. et al. . |
| 3,287,703 | 11/1966 | Slomick . |
| 3,296,426 | 1/1967 | Ball . |
| 3,313,926 | 4/1967 | Minnick . |
| 3,423,646 | 1/1969 | Cubert et al. ................... 340/825.83 |
| 3,462,742 | 8/1969 | Millen et al. . |
| 3,473,160 | 10/1969 | Wahlstrom . |
| 3,514,543 | 11/1970 | Crawford et al. ................... 340/324 |
| 3,535,498 | 10/1970 | Smith, Jr. . |
| 3,566,153 | 2/1971 | Spencer, Jr. ......................... 307/468 |
| 3,602,733 | 8/1971 | Aoki ..................................... 307/209 |
| 3,702,985 | 11/1972 | Probsting ......................... 340/166 R |
| 3,737,866 | 6/1973 | Gruner ............................. 340/172.5 |
| 3,757,306 | 9/1973 | Boone ............................. 340/172.5 |
| 3,769,525 | 10/1973 | Foss et al. ......................... 307/254 |
| 3,774,171 | 11/1973 | Regetz ............................... 365/105 |
| 3,792,242 | 2/1974 | Priel ................................... 307/209 |
| 3,795,901 | 3/1974 | Boehm et al. ..................... 340/172.5 |
| 3,798,606 | 3/1974 | Henle et al. ...................... 340/172.5 |
| 3,803,587 | 4/1974 | Mead ................................. 340/336 |
| 3,816,725 | 6/1974 | Greir .................................. 364/716 |
| 3,818,252 | 6/1974 | Chiba et al. ....................... 307/303 |
| 3,818,452 | 6/1974 | Greer ............................. 340/825.83 |
| 3,832,489 | 8/1974 | Kreshna .............................. 178/71 |
| 3,849,638 | 11/1974 | Greer .................................. 364/716 |
| 3,906,255 | 9/1975 | Mensch, Jr. ....................... 307/448 |
| 3,912,947 | 10/1975 | Buchanan .......................... 307/269 |
| 3,924,243 | 12/1975 | Vermeulen ......................... 364/900 |
| 3,967,059 | 6/1976 | Moore, III et al. .................. 178/58 |
| 3,974,366 | 8/1976 | Hebenstreit ........................ 364/716 |
| 3,979,730 | 9/1976 | Bennett et al. ..................... 364/200 |
| 3,983,538 | 9/1976 | Jones ................................. 364/716 |
| 3,987,286 | 10/1976 | Homlager .......................... 235/152 |
| 3,987,410 | 10/1976 | Beausoleil et al. ............... 340/146.3 |
| 3,990,045 | 11/1976 | Beausoleil et al. ............... 340/146.3 |
| 4,034,349 | 7/1977 | Monaco et al. .................... 364/200 |
| 4,034,356 | 7/1977 | Howley et al. .................... 340/173 |
| 4,037,089 | 7/1977 | Horncager ......................... 235/152 |
| 4,044,312 | 8/1977 | D'Ortenzio ........................ 328/165 |
| 4,078,259 | 3/1978 | Soulsby et al. .................... 364/900 |
| 4,091,359 | 5/1978 | Rossier ........................... 340/166 R |
| 4,093,998 | 6/1978 | Miller ................................. 364/900 |

(List continued on next page.)

FOREIGN PATENT DOCUMENTS 1444084 7/1976 United Kingdom .

OTHER PUBLICATIONS

"CMOS EPLA and Gate Arrays" Atmel High Density UV Erasable Programmable Logic Device, pp. 19 & 24 & 20.

(List continued on next page.)

*Primary Examiner*—Edward P. Westin
*Assistant Examiner*—Jon Santamauro
*Attorney, Agent, or Firm*—Angus C. Fox, III

[57] ABSTRACT

A programmable logic device (PLD) with an output macrocell circuit is disclosed. Specifically, there is a macrocell having an exclusive logic signal feedback line and an exclusive external input signal line both feeding into the input of the PLD. Exactly, this PLD can disable the I/O pad and still have an internal feedback to its logic circuitry.

2 Claims, 4 Drawing Sheets

U.S. PATENT DOCUMENTS

| | | | |
|---|---|---|---|
| 4,107,785 | 8/1978 | Seipp | 364/900 |
| 4,124,899 | 11/1978 | Birkner et al. | |
| 4,128,873 | 12/1978 | Lamlaux | 364/200 |
| 4,218,740 | 8/1980 | Bennett et al. | 364/200 |
| 4,422,072 | 12/1983 | Cavlan | 340/82.87 |
| 4,554,640 | 11/1985 | Wong et al. | 364/716 |
| 4,717,912 | 1/1988 | Hawey et al. | 340/825.87 |
| 4,742,252 | 5/1988 | Agrawal | 307/465 |
| 4,758,746 | 7/1988 | Birkner et al. | 307/465 |
| 4,763,020 | 8/1988 | Takata et al. | 307/465 |
| 4,771,285 | 9/1988 | Agrawal et al. | 340/825.83 |
| 4,789,951 | 12/1988 | Birkner et al. | 307/465 |
| 4,847,612 | 7/1981 | Kaplinsky | 340/825.800 |
| 4,879,481 | 11/1989 | Pathak et al. | 307/465 |
| 4,918,641 | 4/1990 | Jigour et al. | 364/716 |
| 4,963,768 | 10/1990 | Agrawal et al. | 307/465 |
| 4,967,107 | 10/1990 | Kaplinsky | 307/465 |
| 5,012,135 | 4/1991 | Kaplinsky | 307/465 |
| 5,027,011 | 6/1991 | Steele | 307/465 |
| 5,027,315 | 6/1991 | Agrawal et al. | 307/465 |
| 5,028,821 | 7/1991 | Kaplinsky | 307/465 |
| 5,055,718 | 10/1991 | Galbraith et al. | 307/465 |
| 5,059,828 | 10/1991 | Tanagawa | 307/465 |
| 5,121,006 | 6/1992 | Pedersen | 307/465 |
| 5,136,188 | 8/1992 | Ha et al. | 307/465 |
| 5,148,391 | 9/1992 | Zagar | 365/96 |
| 5,166,556 | 11/1992 | Hsu et al. | 307/465 |
| 5,168,177 | 12/1992 | Shankar et al. | 307/465 |
| 5,247,195 | 9/1993 | Turner et al. | 307/475 |
| 5,287,017 | 2/1994 | Narasimhan et al. | 307/465 |

OTHER PUBLICATIONS

J. E. Elliott et al., "Array Logic Processing", IBM, Tech. Disclosure Bulletin, vol. 18, No. 21, Jul. '73, pp. 219 & 220.

H. Fleisher et al., "Reconfigurable Machine", IBM Tech. Disclosure Bulletin, vol. 16, No. 10 Mar. 1974, pp. 221, 222 & 223.

W. Carr et al., MOS/LSI Design and Applications pp. 229-258.

H. Fleisher et al, "An Introduction to Array Logic" IBM J. Research & Development, Mar. 1975, pp. 98-104.

Jones "Array Logic Macros" IBM J. Research and Development Mar. 1975, pp. 120-126.

Andres, "MOS Programmable, Logic Arrays" A Texas Instrument Application Report Oct. 1970 pp. 1-13.

Barna et al, Integrated Circuits in Digital Electronics John Wiley & Sons 1973, pp. 412-419 and 84-91 and FIGS. 11-34.

Wood "High-Speed, Dynamic Programmable Logic Array Chip" IBM J. Res. Develop. Jul. 1975, pp. 379-381.

Boysel, "Memory on a Chip: a step toward Large-Scale Integration" Electronics, Feb. 6, 1967 pp. 93-97.

Wilks et al "The Design of the Control Unit of an Electronic Digital Computer" The Institution of Electrical Engineers, Jun. 1957, pp. 121-128.

Mrazek, "Plas Replace ROMs per Logic Designs" Electronic Design Oct. 25, 1973 pp. 66-70.

Howley et al. "Programmable Logic Array Decoding Technique" IBM Tech. Disclosure Bulletin, vol. 17, No. 10, Mar. 1975-p. 2988.

Henel "The PLA: A different land of ROM" Electronic Design, Jan. 5, '76 pp. 78-84.

Calvan et al. "FPLA Applications-Exploring Design Problems and Solutions" pp. 63-69 Source and data N/A.

Kidder, The Soul Of A New Machine, 1982 pp. 118-128 and 268-269.

National Semiconductor Inc. "Data Update MOS." Aug. 1972, pp. 86 and 87.

Blakeslee Digital Design With Standard MSI and LSI, John Wiley and Sons, 1975, pp. 67-77, 94-99, and 104-105.

PAL Handbook, Monolithic Memones, Inc. 1978 p. N/A.

Hutton et al. "A Simplified Summation Array for Cellular Logic Modules" IEEE Trans. On Computers, Feb. 1974 pp. 203-206.

Programmable Logic-A Basic Guide for the Designer, Data I/O Corp. 1983-pp. 20-25.

The TTL Data Book for Design Engineers, Texas Instruments Inc., 1973 pp. 295, 303, 473, 458 and 480.

Ramaswamy et al, "Second generation PAL programmers" Wescon/83 Professional Program Session Record, Session 13.

Monolethic Memones Inc. Form 10-K, Oct. 3, 1982 Annual Report Pursuant to Section 13 or 15(2) of the Securities Exchange Act of 1934.

(List continued on next page.)

OTHER PUBLICATIONS

"The Role of Software in the Growth of PLDs" The Technology Research Group Letter, vol. 1 No. 13, Nov. 1985 p. 3.

Teil et al. "A Logic Monomyer for VLSi PLA Design" ACM IEEE Ninteenth Design Automation conf. Proceedings, Jun. 82, pp. 156–162.

Marrin "Programmable Logic Devices Gain Software Support" EDN Feb. 9, 1984, pp. 67–74.

Cole et al., "Next Generation Programmable Logic" Wescon/84, Professional Program Session Record Session 19.

Monolithic Memones Annual Report 1981, Letter to Shareholders p. 2.

"Semicustom IC Update, Field Programmable Logic Devices," VLsI from the Valley, Hambrecht & Gust Inc. vol. 3 No. 1, Mar. 86 pp. 4–7.

Phelps Institutional Research Report on Bonolithic Memoues, Inc., A publication of Woodman, Kirkpatrick & Gilbrath Aug. 30, 1984.

Wood, "High-Speed Dynamic Programmable Logic Array Chip" IBM J. Res. Develop Jul. 1975, pp. 379–381.

Cavlan et al. "Field PLAS Simplify Logic Designs" reprinted from Electronic Design, Sep. 1, 1975.

Signetics, Bipolar and Mos Memory Data Manual Signetics Inc, pp. 156–165 Jan. 1979.

Dorman "PLAS on MPs at times they complete at time they cooperate" Electronic Design, 18 Sep. 1, 1976, pp.24–30.

Elliot et al. "Array Logic Processing" IBM Tech. Disclosure Bulletin, vol. 16, No. 2, Jul. 1973 pp. 586–587.

MacWorld, The Macintoch Magazine, May–June 1984. "Programmable Logic Arrays" MOS/LSI Design and Application, p. 102.

H. Fleisher et al. "An Introduction to Array Logic" IBM J. Res. Development, p. 132.

"User–Programmable Logic Devices and Eracability and Hit New Density Levels", Electronic Products, p. 276.

Use of Laser Mechanism in Printus Breaks Prue and Maintenance Barriers, Jan. 15, 1985 p. 277.

PROGRAMMABLE LOGIC DEVICE MACROCELL WITH AN EXCLUSIVE FEEDBACK AND AN EXCLUSIVE EXTERNAL INPUT LINE FOR A COMBINATORIAL MODE AND ACCOMMODATING TWO SEPARATE PROGRAMMABLE OR PLANES

CROSS-REFERENCE TO RELATED APPLICATIONS

This application is a continuation of application Ser. No. 07/884,505 filed May 15, 1992, now abandoned.

U.S. pat. app. Ser. No. 07/817,167, filed Jan. 6, 1992, is a CMOS logic cell for high-speed, zero-power programmable array logic devices, having common assignee with the present invention.

U.S. pat. app. Ser. No. 07/865,007, filed Apr. 8, 1992, is a field programmable logic array with speed optimized architecture, having common assignee with the present invention.

U.S. pat. app. Ser. No. 884,104, filed May 15, 1992, now U.S. Pat. No. 5,220,215, attorney docket No. 91-439, is a field programmable logic array with two OR planes, having common assignee with the present invention.

U.S. pat. app. Ser. No. 884,489, filed May 15, 1992, now U.S. Pat. No. 5,287,107, attorney docket No. 92-63, is a programmable logic device macrocell with two or array inputs, having common assignee with the present invention.

U.S. pat. app. Ser. No. 883,759, filed May 15, 1992, now abandoned, attorney docket No. 92-59, is a programmable logic device with a single parameter state decode, having common assignee with the present invention.

U.S. pat. app. Ser. No. 883,076, filed May 15, 1992, now U.S. Pat. No. 5,331,227, attorney docket No. 92-256, is a programmable logic device macrocell with an exclusive feedback line and an exclusive external input line, having common assignee with the present invention.

U.S. pat. app. Ser. No. 883,843, filed May 15, 1992, attorney docket No. 92-273, is a programmable logic device with an exclusive feedback line and an exclusive external input liine for a state counter or registered sum-of-products signal, having common assignee with the present invention.

U.S. pat. app. Ser. No. 883,078, filed May 15, 1992, now U.S. Pat. No. 5,300,830 attorney docket No. 92-275, is a programmable logic device macrocell with an exclusive feedback line and an exclusive external input line for registered and combinatorial modes using a dedicated product term for control, having common assignee with the present invention.

FIELD OF THE INVENTION

The present invention relates to integrated circuits (ICs), specifically field programmable logic arrays (FPLA). Particularly, an FPLA having macrocells that contain a faster, more flexible, and exclusive feedback line as well as an exclusive external-input line from an input/output (I/O) pad. Moreover, there is an integrated circuit which can disable the output pad and still maintain a feedback of the sum-of-products in the combinatorial mode.

BACKGROUND OF THE INVENTION

The introduction of programmable logic devices (PLDs) was a true revolution in the hardware design world. It enabled engineers to shrink circuits requiring several devices onto a single device thus simplifying their designs while saving space and power. Traditionally, PLDs have been used in combinational circuits such as address decoders as well as sequential circuits such as bus arbitration schemes. During the last few years, advances and improvements in PLD architectures enabled the devices to grow more complex while addressing the never-ending quest for higher density and faster speeds. Despite these improvements, engineers still face certain problems and limitations when implementing state machine designs with PLDs.

A typical programmable logic device is composed of a user-programmable AND array, a fixed or programmable OR gate or array, followed by a macrocell comprising output registers, a feedback path to the programmable AND array, and output pads. The existence of a feedback path from the output registers or buffers to the AND array makes PLDs ideal candidates for state machine implementations.

Although the feedback paths allow for architecture that implements state machines these architectures have been encumbered with inefficient and non-flexible feedback paths. Specifically, these paths have incorporated unnecessary gate delays like three-states or registers, and not having several modes of operation. Moreover, these inflexible paths never allow for a disabled tri-state and still have feedback intact for the combinatorial mode.

For example, FIG. 1, is a related design which implements an inefficient feedback path. Particularly, while in an output mode, programmable logical OR array 10 couples signals to three-state (output buffer) 12 where signals are coupled to output pad 14 and input buffer 16 via feedback line 18.

One skilled in the art will understand that a three-state, such as 12, has a relatively large signal delay and creates a large amount of signal noise. Additionally, it is easily noted that there is no exclusive feedback line, but a sharing of the feedback and input line in the combinatorial mode. Moreover, there is no way to disable the output pad buffer 12 and still be able to feedback the sum-of-products via line 18. This ability to disable yet still feedback is a mode of operation that would be very useful to engineers in their uses of integrated circuits.

Therefore, a need exists for a combinatorial mode macrocell which has an efficient and more flexible feedback path, yet provides for an input line from the I/O pad for the combinatorial mode. Particularly, a feedback path which avoids unnecessary signal noise being injected (returned) into the logic array, and that feeds back even when the pad is disabled.

It is noted that the above described problems, as well as other problems, are solved through the subject invention and will become more apparent, to one skilled in the art, from the detailed description of the subject invention.

SUMMARY OF THE INVENTION

One skilled in the art will appreciate the advantage of the subject combinatorial macrocell architecture. Specifically, there is an integrated circuit which has a feedback path which avoids the unnecessary signal noise emanating from the use of a 3-state device or output driver; and there is a feedback path which is activated even when the I/O pad driver is disabled. Clearly, providing an exclusive logic signal feedback line to the logic circuitry and providing an exclusive external signal input line to the logic circuitry for the combinatorial mode will solve the subject problems and provide the additional flexibility.

Features of the present invention will become more clear from the following detailed description of the invention, taken in conjunction with the accompanying drawings.

DETAILED DESCRIPTION OF THE ILLUSTRATED EMBODIMENT

Incorporated Material

For the purpose of providing background material which may in some respects illustrate the state of the art, the following books are herein incorporated by reference: "Programmable Logic Handbook," fourth edition, by Monolithic Memories Inc., 2175 Mission College Blvd., Santa Clara, Calif.; and "Practical Design Using Programmable Logic," by D. Pellerin and M. Holley, Prentice Hall, library of Congress No. TK7872 .L64 P44 1991.

The following U.S. patents are herein incorporated by reference: U.S. Pat. No. 3,423,646, is a computer logic device consisting of an array of tunneling diodes, isolators and short circuits. U.S. Pat. No. 3,566,153, is a programmable sequential logic device. U.S. Pat. No. 4,124,899, is a programmable array logic circuit. U.S. Pat. No. 4,717,912, an apparatus for producing any one of a plurality of signals at a single output. U.S. Pat. No. 4,758,746, is a programmable logic array with added array of gates and added output routing flexibility.

Definitions

A macrocell is generally defined as an output circuitry coupled to the end of a logic circuitry—such as a logical OR array—and containing multiplexers, buffers, drivers, registers, etc., and sometimes an input/output pad. "External inputs" terminology is used to describe the fact that the input/output (I/O) pad allows for input signals from an external source as well as outputting signals over the pad. "Sum-of-products" is a term used to describe a resultant signal that has gone through a logical AND array and a logical OR array. Combinatorial mode refers to the fact that there are two logical OR array outputs. A first has outputs which are registered, having signals routed through a register, and is referred to as a registered mode. The second outputs do not register the outputs and are referred to as a combinatorial or combinational mode.

Specific Embodiment

Figure 1:
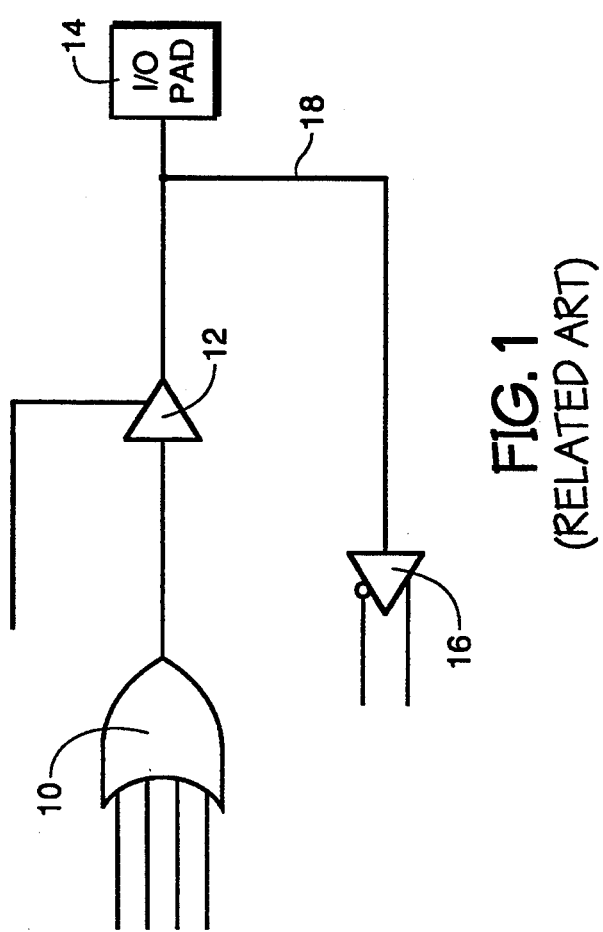
FIG. 1 illustrates a related art macrocell architecture.
Figure 2:
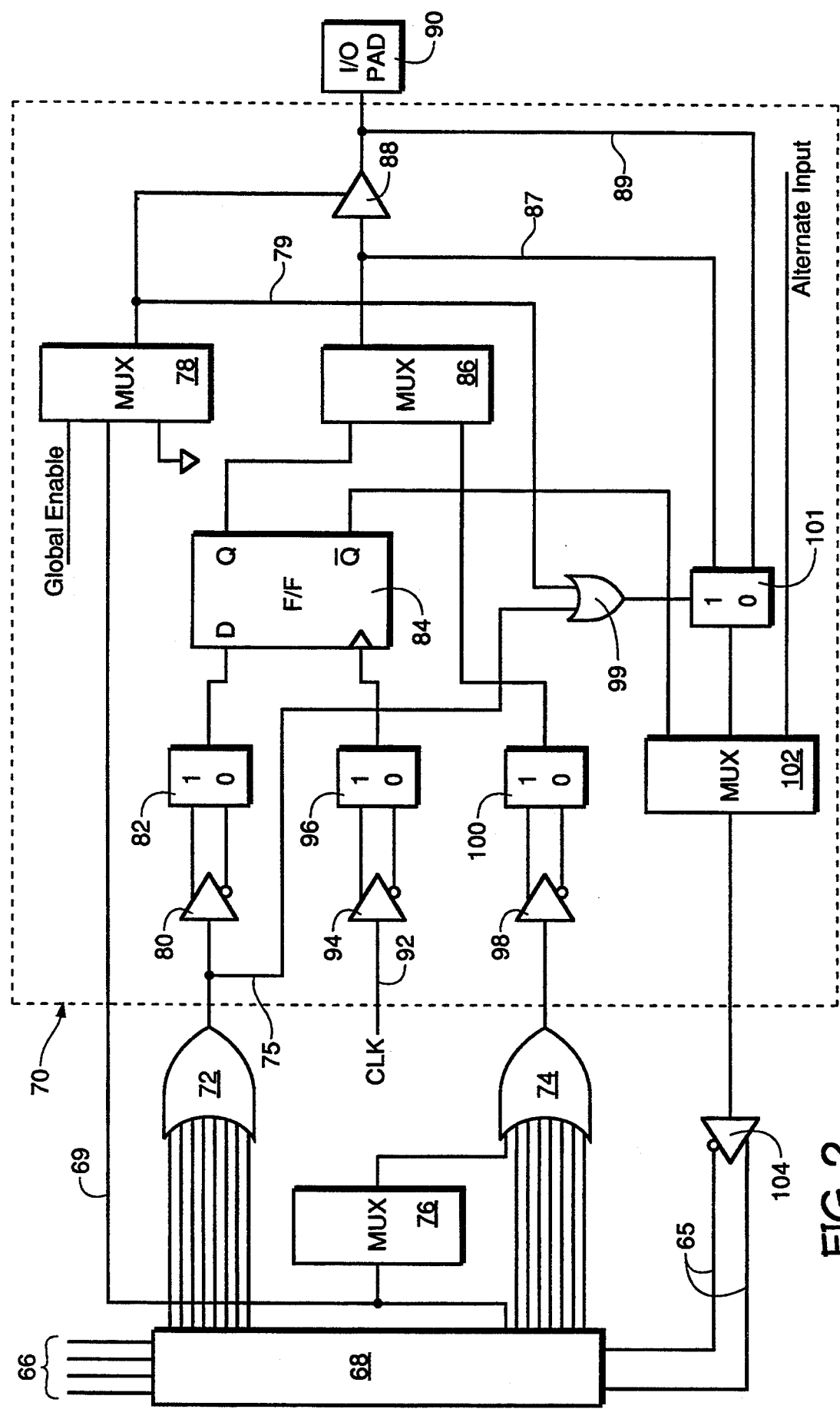
FIG. 2 is a detailed illustration of the invention.

FIG. 2 is a detailed illustration of the invention and includes the following elements: Leading into the macrocell 70 are two OR arrays 72 (registered mode) and 74 (combinational mode). 8×1 multiplexer 76 takes a product term from OR array 74 to 8×1 multiplexer 78 having a global enable line and other possible selections commonly used. From array 72 there is a buffer 80, multiplexer 82, a D-type flip-flop or register 84 (register mode creating), an 8×1 multiplexer 86, a tri-state 88 (or input/output driver), and pad 90. Clock signal, CLK, 92 is coupled to register 84 via buffer 94 and multiplexer 96. Array 74 couples to multiplexer 86 via buffer 98 and multiplexer 100. Also, AND array 68 has a product term coupled to mux 78 via line 69. It is further noted that line 69 is routed directly from AND array 68 to mux 78, and does not go to an OR array unless grabed by mux 76. An 8×1 multiplexer 102 has inputs from mux 101, register 84 via Q-bar, and an alternate input; the lone output is an input line to programmable AND array 68 via input buffer 104 and AND array input lines 65. AND array 68 also has inputs 66. Mux 101 has inputs from exclusive input line 89 and exclusive feedback line 87. Mux 101 is controlled from logical Or gate 99. OR gate 99 has inputs from an output from OR array 72 via line 75, and mux 78 via line 79.

Modes of Operation

Figure 3A:
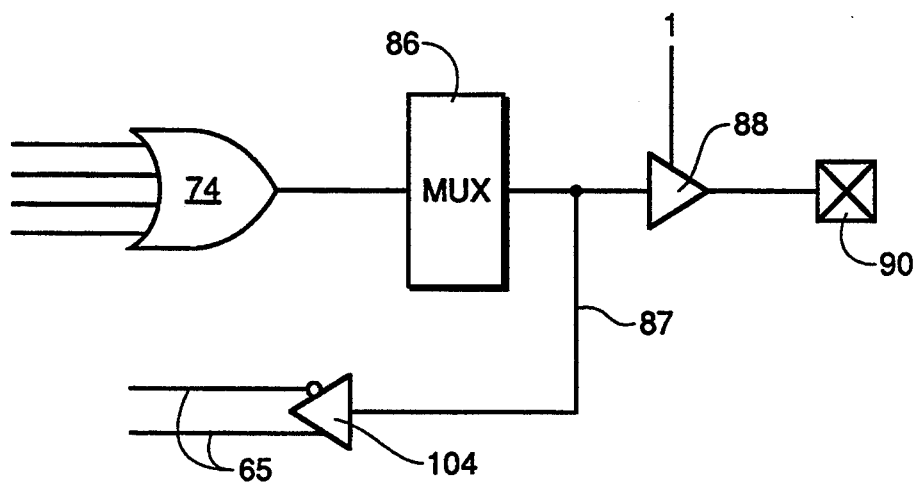
FIGS. 3A–3C are illustrations of configurable modes of operation for the invention.

One skilled in the art will appreciate the operation of the invention. Specifically, there are three primary combinatorial modes for the macrocell circuit. The first combinatorial mode, referring to FIGS. 2 and 3A, occurs when mux 78 enables 3-state 88, by sending a logical "1". This mode allows for outputting of logic signals from the logic circuitry (arrays 72 and 74) over I/O pad 90. Simultaneously, in this first mode, mux 101 is set to a "1" which is controlled from the logical OR 99 receiving a signal from mux 78 via line 79 and a signal from OR array 72 via line 75. Thus, selecting the exclusive logic signal feedback line 87. Thereby allowing feedback logic signals to be coupled to logic circuit input lines 65 via AND array input mux 102 and input buffer 104.

Figure 3B:
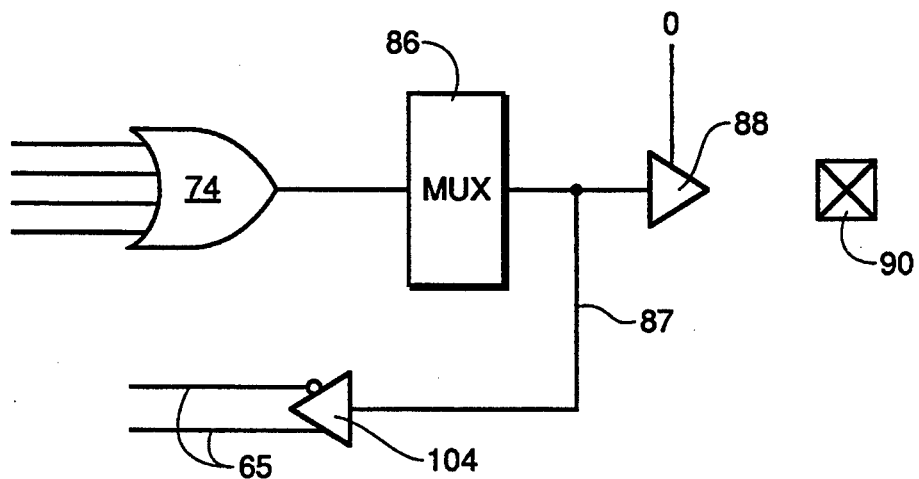

Referring to FIGS. 2 and 3B, the macrocell's second combinatorial mode occurs when mux 78 disables three-state 88, by sending a logical "0". Thus not allowing any signals to output over pad 90. Simultaneously, mux 101 is set to a "1" which operates as described in the first mode above. Thus, again selecting the exclusive logic signal feedback line 87 as described in the first mode above. Specifically, in this second mode, the circuitry is capable of having the pad 90 disabled yet have signals from array 74 feed back into the logic circuitry of AND array 68.

Figure 3C:
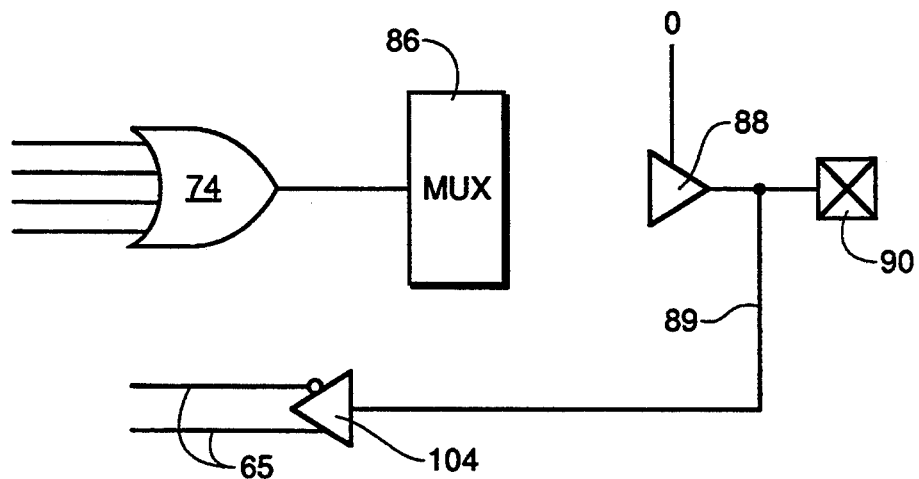

Referring to FIGS. 2 and 3C, the third combinatorial mode occurs when mux 78 disables three-state 88, as described in mode two and achieving the same results. Simultaneously, and unlike the previous modes, mux 101 is set to a "0" by a similar fashion as described above. Thus, exclusive input line 89 is selected and feeds into AND 68 in a similar fashion as described above.

Figure 4:
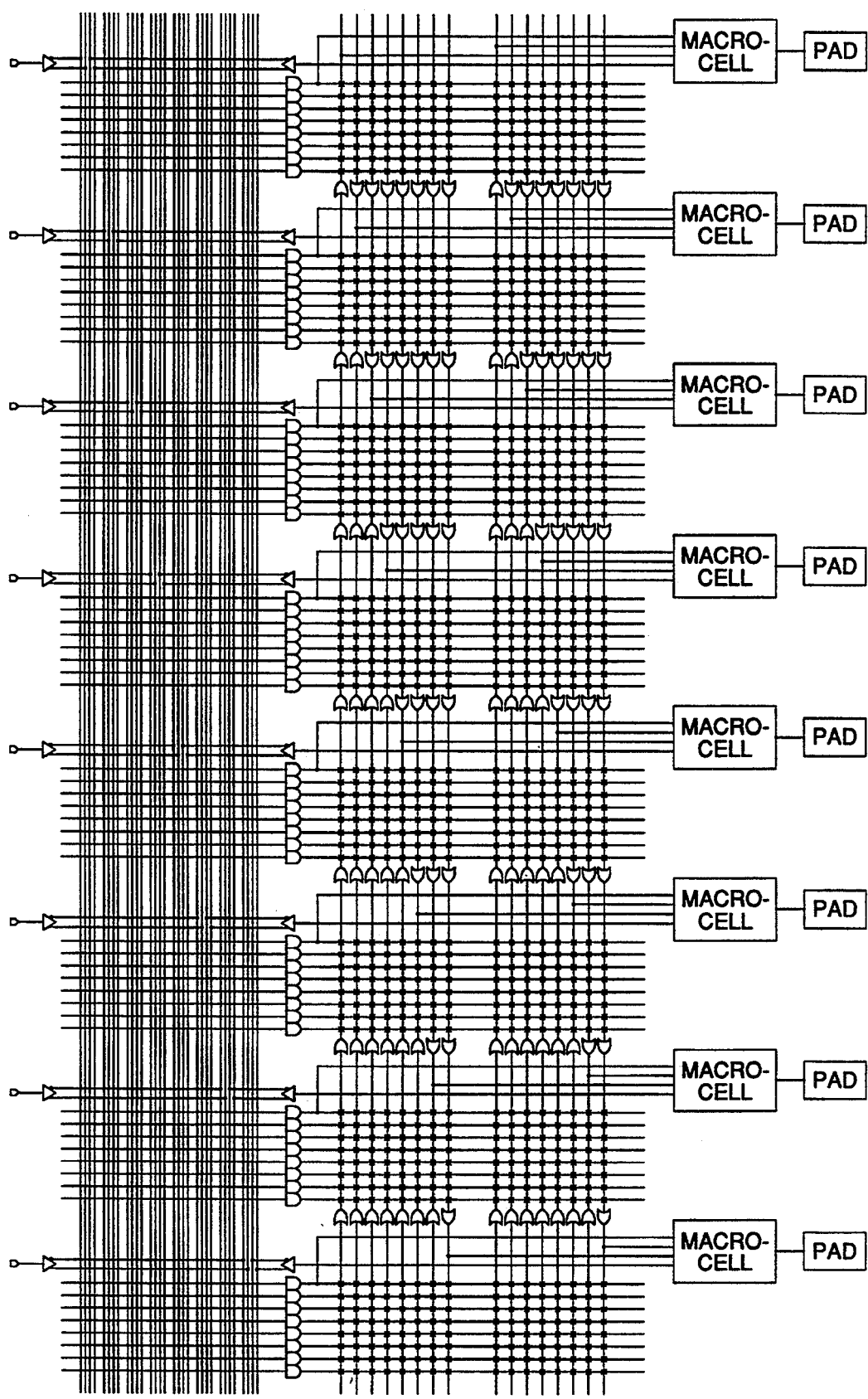
FIG. 4 illustrates an embodiment of the invention being utilized in a field programmable logic device.

FIG. 4 illustrates an embodiment of the invention being utilized in a field programmable logic device having a programmable AND and two programmable OR arrays.

VARIATIONS IN THE INVENTION

There are several obvious variations to the broad invention and thus come within the scope of the present invention. Uniquely, this invention may work on any number of ICs utilizing I/O and feedback lines. For example, a PLD using fixed ORs or static logic. Field programmability is not required for utilizing this invention.

While the invention has been taught with specific reference to one embodiment, someone skilled in the art will recognize that changes can be made in form and detail without departing from the spirit and the scope of the invention.

Although subheadings in the Detailed Description of the Illustrated Embodiment are used, these are merely provided for assisting the reader; wherein, the writer is free to enter any information under any heading/s.

I claim:

1. A programmable logic device comprising:
   a) an AND array having multiple inputs and multiple product term outputs;
   b) first and second OR arrays, each OR array receiving, as inputs, product term outputs from the AND array, each OR array having a single sum-of products output; and
   c) an output macrocell having
      c1) a first input for receiving the sum-of-products output from the first OR array;
      c2) a second input for receiving the sum-of-products output from the second OR array;
      c3) a third input for receiving a single product term output from the AND array;
      4) means for generating a registered signal, said means for generating having a first input coupled to the sum-of-products output of said first OR array, and a second input coupled to a clock signal;
      c5) a first multiplexer having a first input for receiving the registered signal, and a second input for receiving a non-registered signal derived from the sum-of-products term output of said second OR array, said first multiplexer having an output, and being operable so as to select between the registered signal and the non-registered signal, and providing the signal so selected at its output;
      c6) a tri-statable gate which either couples the selected signal to an input/output terminal or decouples the selected signal from the input/output terminal;
      c7) a logic gate having an output, a first input coupled to the sum-of-products term output of said first OR array, and a second input coupled to the single product term output from the AND array; and
      c8) a second multiplexer having an output coupled to at least one of said inputs of said AND array, said second multiplexer also having first and second inputs, said first input being coupled to the output of said first multiplexer, and said second input being coupled to the input/output terminal, said second multiplexer being controlled by the output of said logic gate.

2. A programmable logic device comprising:
   (a) an AND array having multiple inputs and multiple product term outputs;
   (b) a first OR array having a first single sum-of-products output, and also having multiple inputs comprising a plurality of product term outputs from said AND array;
   (c) a second OR array having a second single sum-of-products output, and also having multiple inputs comprising a plurality of product term outputs from said AND array;
   (d) means for receiving a clock signal;
   (e) an output macrocell having;
      (1) a first macrocell input corresponding to said first single sum-of-products output;
      (2) a second macrocell input corresponding to said second single sum-of-products output;
      (3) a third macrocell input corresponding to a single product term output from said AND array, said single product term output also serving as one of said plurality of inputs to said second OR array;
      (4) means for generating a registered signal, said means for generating having at least first and second inputs, the first input of said means for generating being coupled to said first single sum-of-products output, and the second input of said means for generating being coupled to said clock signal;
      (5) a first multiplexer for selecting between the registered signal and a non-registered signal derived from said second single sum-of-products output, said first multiplexer having an output providing a signal so selected;
      (6) a tri-statable gate which either couples the selected signal to an input/output terminal or decouples the selected signal from the input/output terminal, said tri-statable gate being controlled by said single product term outlet;
      (7) a logic gate having an output, a first input coupled to said first single sum-of-products output, and a second input coupled to said single product term output; and
      (8) a second multiplexer having an output coupled to at least one of said inputs of said AND array, and first and second inputs, said first input being coupled to the output of said first multiplexer, and said second input being coupled to the input/output terminal, said second multiplexer being controlled by the output of said logic gate.

* * * * *